United States Patent
Mathew

(10) Patent No.: US 8,394,713 B2
(45) Date of Patent: Mar. 12, 2013

(54) METHOD OF IMPROVING ADHESION OF BOND PAD OVER PAD METALLIZATION WITH A NEIGHBORING PASSIVATION LAYER BY DEPOSITING A PALLADIUM LAYER

(75) Inventor: Varughese Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 196 days.

(21) Appl. No.: 12/705,021

(22) Filed: Feb. 12, 2010

(65) Prior Publication Data

US 2011/0198751 A1     Aug. 18, 2011

(51) Int. Cl.
*H01L 21/445* (2006.01)
(52) U.S. Cl. ............ 438/612; 257/E23.01; 257/781; 257/76
(58) Field of Classification Search .......... 257/76, 257/781, E23.01; 438/612
See application file for complete search history.

(56) References Cited

U.S. PATENT DOCUMENTS

| | | |
|---|---|---|
| 4,840,924 A | 6/1989 | Kinbara |
| 5,910,644 A | 6/1999 | Goodman et al. |
| 6,445,069 B1 | 9/2002 | Ling et al. |
| 6,506,314 B1 | 1/2003 | Whitney, Jr. et al. |
| 6,698,648 B2 | 3/2004 | Wunderlich et al. |
| 6,800,555 B2 | 10/2004 | Test et al. |
| 2004/0124509 A1* | 7/2004 | Kim et al. ............ 257/678 |
| 2006/0226544 A1 | 10/2006 | Hsu et al. |
| 2006/0249801 A1* | 11/2006 | Matsuo ............... 257/415 |
| 2009/0102032 A1* | 4/2009 | Schneegans et al. ...... 257/676 |
| 2010/0032660 A1* | 2/2010 | Nomoto et al. .......... 257/40 |

OTHER PUBLICATIONS

Clauberg, "Nickel-Palladium Bond Pads for Copper and Gold Wire Bonding", Abstract for Wirebond_2009 technical program.*
Chylak et al., Next Generation Nickel-Based Bond Pads Enable Copper Wire Bonding. ECS Transactions 12009, vol. 18,Issue 1, p. 777-785.*
PCT/US2010/059662 International Search Report and Written Opinion mailed Aug. 2, 2011.

* cited by examiner

*Primary Examiner* — Fernando L Toledo
*Assistant Examiner* — Peter Bradford
(74) *Attorney, Agent, or Firm* — Robert L. King; Jonathan N. Geld

(57) ABSTRACT

A semiconductor device structure has a semiconductor die that has a bond pad with a passivation layer surrounding a portion of the bond pad. A nickel layer, which is deposited, is on the inner portion. A space is between a sidewall of the nickel layer and the passivation layer and extends to the bond pad. A palladium layer is over the nickel layer and fills the space. The space is initially quite small but is widened by an isotropic etch so that when the palladium layer is deposited, the space is sufficiently large so that the deposition of palladium is able to fill the space. Filling the space results in a structure in which the palladium contacts the nickel layer, the passivation layer and the bond pad.

10 Claims, 4 Drawing Sheets

METHOD OF IMPROVING ADHESION OF BOND PAD OVER PAD METALLIZATION WITH A NEIGHBORING PASSIVATION LAYER BY DEPOSITING A PALLADIUM LAYER

FIELD OF THE INVENTION

This invention relates generally to integrated circuits, and more specifically, to the manufacture of semiconductors having metal contacts.

BACKGROUND OF THE INVENTION

Semiconductors typically use metallic bond pads to make electrical connection to underlying circuitry. A metal of choice for bond pads has been and continues to be aluminum because of its reliable deposition and patterning properties. However, aluminum has relatively high resistivity as compared with other metals such as copper. However, bare copper bond pads are known to be susceptible to corrosion and generally not consistent with wiring processes such as traditional wirebonding. Copper bond pads with an aluminum cap have been proposed to overcome such difficulties. Alternatives to using such copper bond pads with coatings is to form bond pads from two or more metals, such as aluminum, gold, nickel, palladium and alloys thereof. Many wire bond structures however will not pass high temperature reliability tests. For example many conventional wire bond structures when subjected to temperatures such as 150 degrees Celsius and above for several hundred hours will exhibit failures such as interfacial voiding and physical separation from underlying connected circuitry. High temperature environments often exist in integrated circuit applications for automotive applications and extended reliability in such applications is crucial. A source of such failures is due to the intermetallic reactions which occur at the boundary of differing metals within a bond pad. The intermetallic compounds which naturally form at an interface between differing metals continue to form in response to a high temperature ambient. Thus, over time, regions of intermetallic compounds in a bond pad will propagate. These regions represent areas in which voids are formed. As voids in the bond pad structure increase in number, the bond pad structure is susceptible to separating from an underlying pad connection to create an electrical failure. Thus there is a need for an improved bond pad that is compact in size and which is reliable for extended years when exposed to a high temperature.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
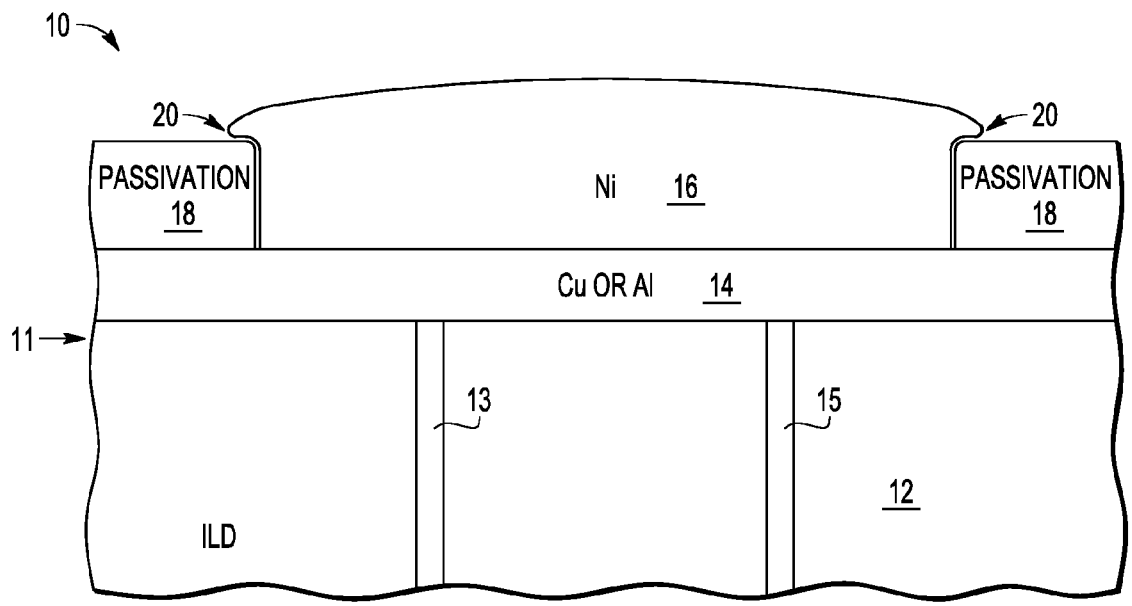
FIGS. 1-6 illustrate in cross-sectional form a bond pad structure and process for forming the structure in accordance with the present invention.

Illustrated in FIG. 1 is a cross-sectional view of a semiconductor device structure 10 which will minimize reliability issues associated with intermetallic compounds caused by prolonged operation at high operating temperatures. A patterned semiconductor die 11 generally has an inter-level dielectric (ILD) 12, an overlying conductive layer 14 and a patterned passivation layer 18. The patterned passivation layer 18 is an insulating, protective material and has an opening which exposes the conductive layer 14. In one form the conductive layer 14 is either copper or aluminum. Conductive paths or vias 13 and 15 are formed within the ILD 12 and electrically connect the conductive layer 14 to circuitry (not shown) underlying the ILD 12. The vias 13 and 15 in one embodiment are formed by patterning and etching the ILD 12. The vias 13 and 15 are filled with an electrically conductive material such as copper. It should be understood that any number of conductive vias may be implemented and that only two per bond pad have been illustrated for convenience.

Formation of the conductive layer 14 depends upon what metal is used. If copper is chosen, in one form, the copper is formed by electroplating. In another form electroless plating of copper may be implemented. If aluminum is used, a physical vapor deposition (PVD) of aluminum is utilized to form the conductive layer 14. The passivation layer 18 is deposited and a conventional passivation material is used for passivation layer 18. A mask is used and exposed portions of the passivation layer 18 are removed to expose the conductive layer 14. These portions of the conductive layer 14 may be referred to as an inner portion of the conductive layer 14 wherein the portion of the conductive layer 14 that underlies the passivation layer 18 is an outer portion of the conductive layer 14. In this form, semiconductor die 11 is ready for further processing to create bond pad structures to form the semiconductor device structure 10. A nickel layer 16 is formed on the conductive layer 14 preferably by electroless plating. Because electroless plating is conventional a detailed discussion of electroless plating will not be made. In another form the nickel layer 16 may be electroplated onto the conductive layer 14. The nickel layer 16 is formed in a conformal manner and has a concave upper surface when electroless plating is employed. The nickel layer 16 has a flat bottom surface that is in direct contact with the conductive layer 14. Depending on the processing methods, there can be intermediate layers (not shown) present between the conductive layer 14 and nickel layer 16. Such intermediate layers may function as adhesion layers, diffusion barriers or substitution layers. The nickel layer 16 generally exhibits an adhesion problem at an interface of the passivation layer 18 and the nickel layer 16. As a result, when nickel thickness is grown beyond a certain thickness, for example above one micron, after thermal treatments and/or under stress conditions, a space 20 exists along the sidewall of the nickel layer 16 and the passivation layer 18. The separation between the nickel layer 16 and the passivation layer 18 causes several problems as subsequent processing of the semiconductor device structure 10 will allow chemicals and moisture to contact the exposed metallic surfaces within the space 20 and corrode metals which cause the formation of voids and lack of device reliability. For example, plating chemicals contain acids and additives such as chlorides and sulfides which will corrode exposed metal within the space 20. After processing is complete, the space 20 is susceptible to being exposed to moisture which will corrode any metal that the moisture comes in contact with.

Figure 2:
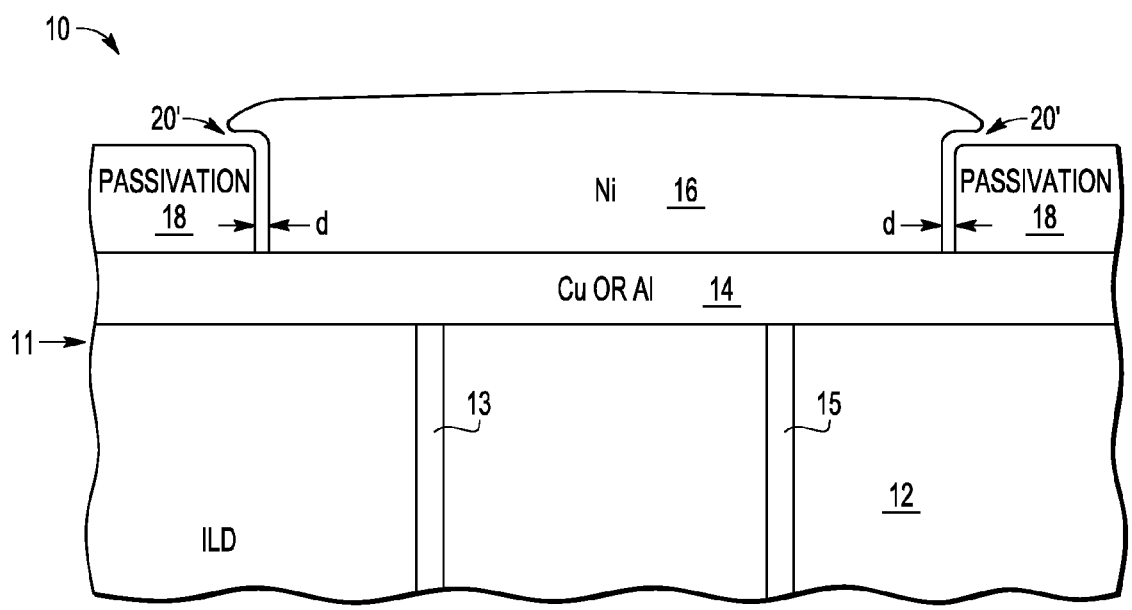

Illustrated in FIG. 2 is a cross-sectional view of further processing of the semiconductor device structure 10 wherein the space 20 between the passivation layer 18 and the nickel layer 16 is increased or widened. A conventional wet etch chemistry is one method used for this purpose. As the wet etch will remove material from all exposed surfaces of the nickel layer 16, both the height of the nickel layer 16 and the side profile of the nickel layer 16 are modified by removal of a portion of the material of nickel layer 16. The wet etch is an isotropic etch using an isotropic etchant and removes exposed nickel from the space 20 to form a modified space 20'. A clean step follows the wet etch to rinse residue from the semiconductor device structure 10. The wet etch has increased the size of the space 20' from a small opening to one which is wide enough to allow formation of a conductive material in a subsequent step. Prior to the wet etch the width of the space 20 was not large enough to be able to form a material within the space 20 to fill the space 20. In some portions of the space 20 the opening may appear to be little more than a gap between the nickel layer 16 and the passivation layer 18 due to the inability of nickel and the passivation material to adhere. However, the wet etch performed in FIG. 2 widens the gap.

Figure 3:
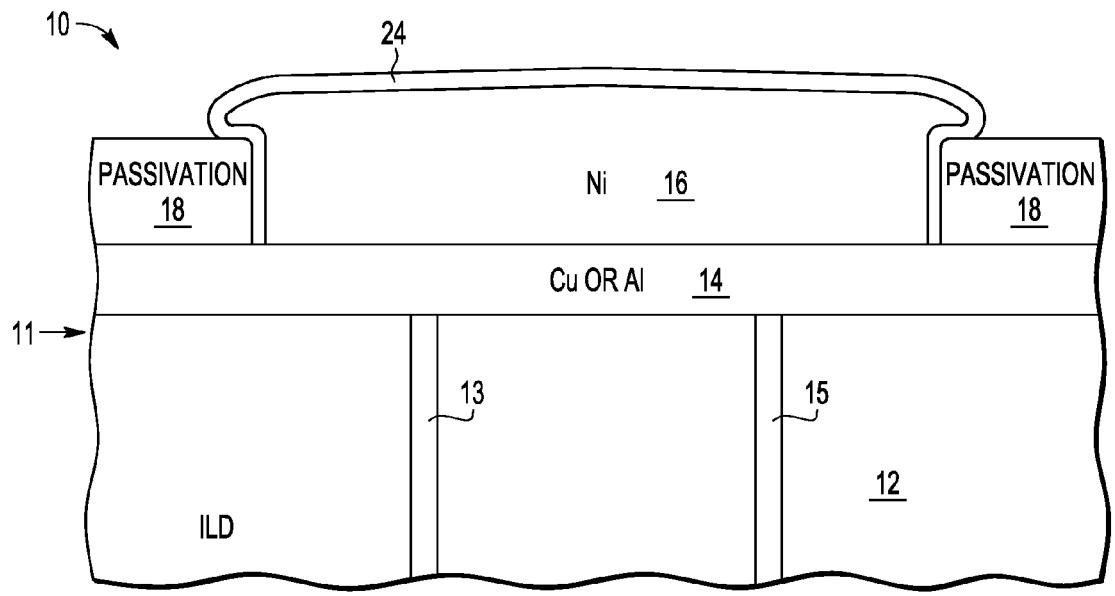

Illustrated in FIG. 3 is a cross-sectional view of further processing of semiconductor device structure 10 wherein a conductive layer 24 of palladium is formed in one embodiment by electroless plating. Palladium is formed on all exposed surfaces of nickel. In another form the palladium is formed by electroplating. The formation of the conductive layer 24 is conformal and fills the space 20' that was widened as illustrated in FIG. 2. As a result, the nickel layer 16 is surrounded on all surfaces by a metal. Palladium exhibits much better qualities of adhesion to passivation layer 18 than nickel does. Also, annealing further improves the adhesion of the palladium to the passivation layer 18. As a result, the conductive layer 24 that is formed extends from the nickel layer 16 and makes adhesive contact with the passivation layer 18. No openings or spaces exist between the nickel layer 16 and the passivation layer 18. Therefore at this point in the processing the nickel layer 16 and the conductive layer 14 are protected on all surfaces from any overlying chemicals and from any moisture to prevent those layers from corrosion.

Figure 4:
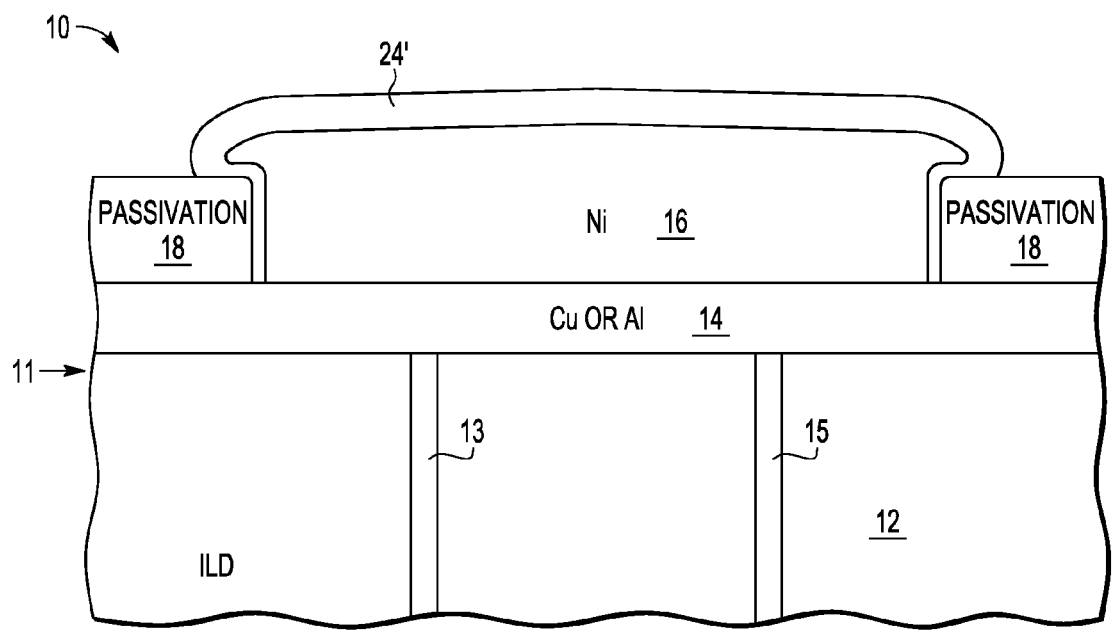

Illustrated in FIG. 4 is a cross-sectional view of further processing of the semiconductor device structure 10 wherein the top surface of the conductive layer 24 of palladium is further increased in thickness to provide increased protection and to improve the adhesion to the passivation layer 18 on the top surface of passivation layer 18. Further electroless plating of palladium is implemented to increase the thickness of conductive layer 24 as illustrated in FIG. 4 to form a modified conductive layer 24' of palladium.

Figure 5:
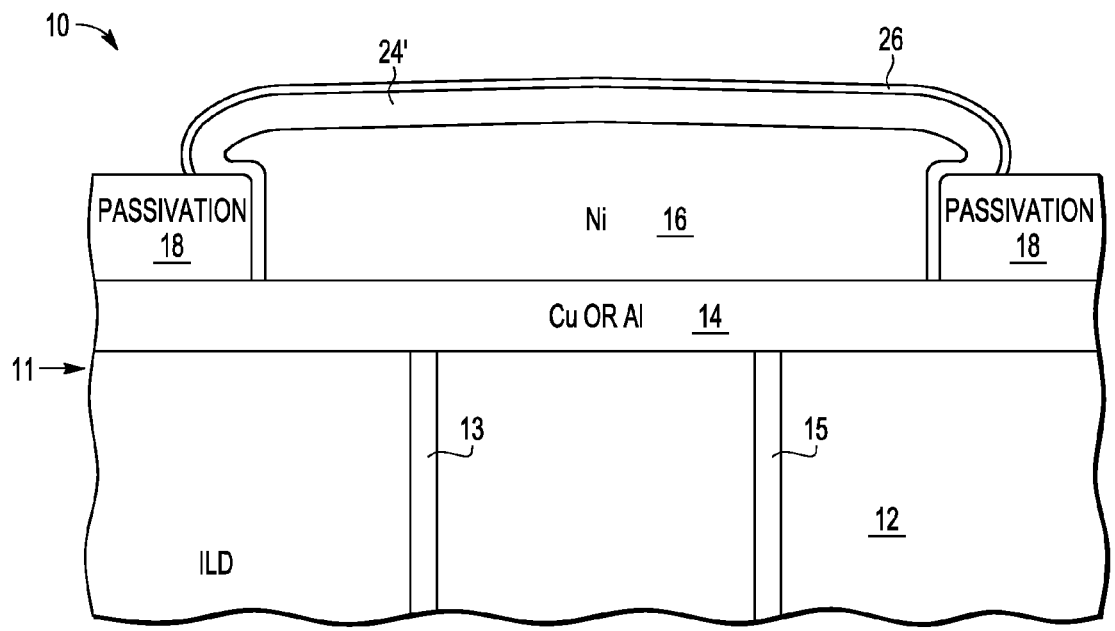

Illustrated in FIG. 5 is a cross-sectional view of yet further processing of the semiconductor device structure 10 wherein a thin metallic layer 26 is formed on the exposed surfaces of modified conductive layer 24'. In one form the metallic layer 26 is gold, Au. The thin metallic layer 26 is preferably formed by electroless or immersion plating. In another form the thin metallic layer 26 is formed by electroplating. When gold is used as the metallic layer 26, the top surface of the semiconductor device structure 10 is the same if a gold ball bond is used. Gold has relatively low resistivity, exhibits good adhesive qualities to palladium and is corrosion resistant. The palladium used in modified conductive layer 24' helps to absorb forces associated with a subsequent wire bonding process to make contact to the metallic layer 26. Plated palladium has a relatively rough surface and thus the overlying metallic layer 26 provides a smoother surface for subsequent processing. The nickel layer 16 has numerous advantages. Nickel exhibits good adhesion to copper or aluminum and permits either material to be used in conductive layer 14. Nickel also is a good diffusion barrier material and thus protects any underlying circuitry within semiconductor die 11. Nickel is relatively straightforward to electroless plate and is a good metal to contact to copper or aluminum with respect to intermetallic reaction.

Figure 6:
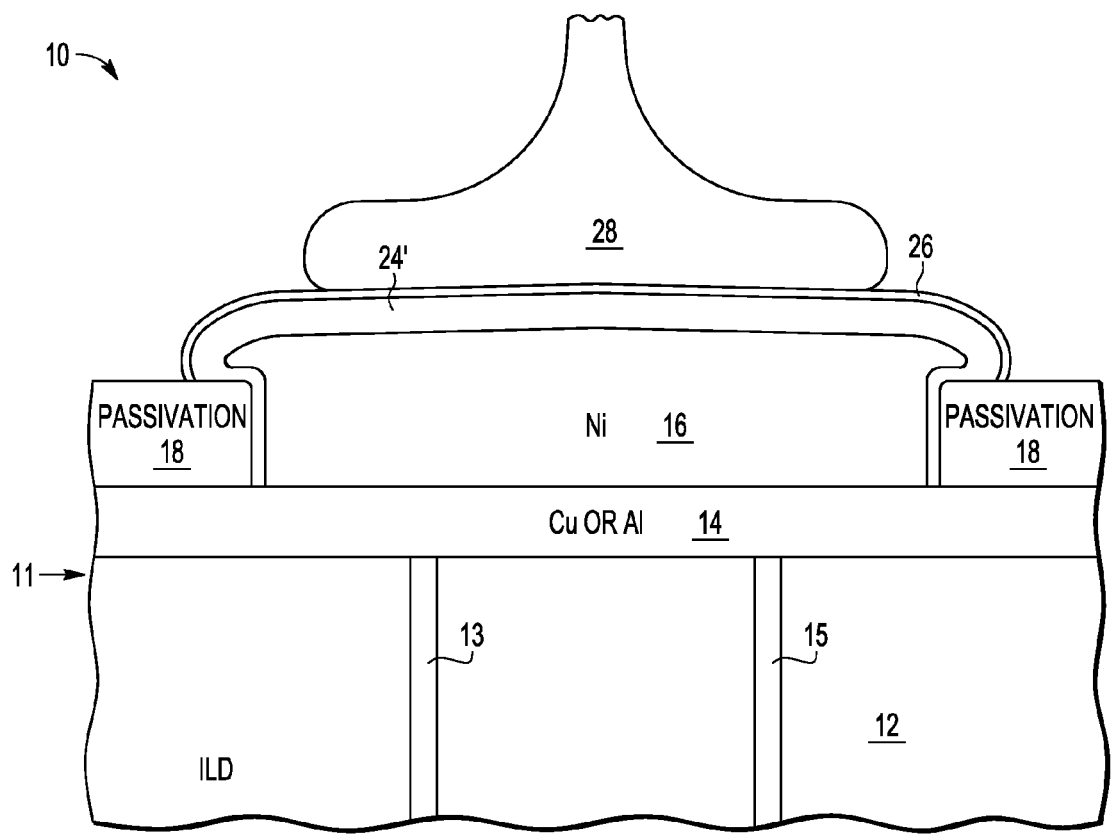

Illustrated in FIG. 6 is a cross-sectional view of further processing of the semiconductor device structure 10. A ball bond 28 having a lead attached at the top is formed by conventional thermosonic bonding which is a combination of compressive force and temperature. In one form the ball bond 28 is formed of either gold or copper. Other conductive structures may be used in lieu of the ball bond 28. In particular, a conventional stitch bond may be used or a conductive ball or bump may be formed in adhesive contact with the thin metallic layer 26.

Figure 7:
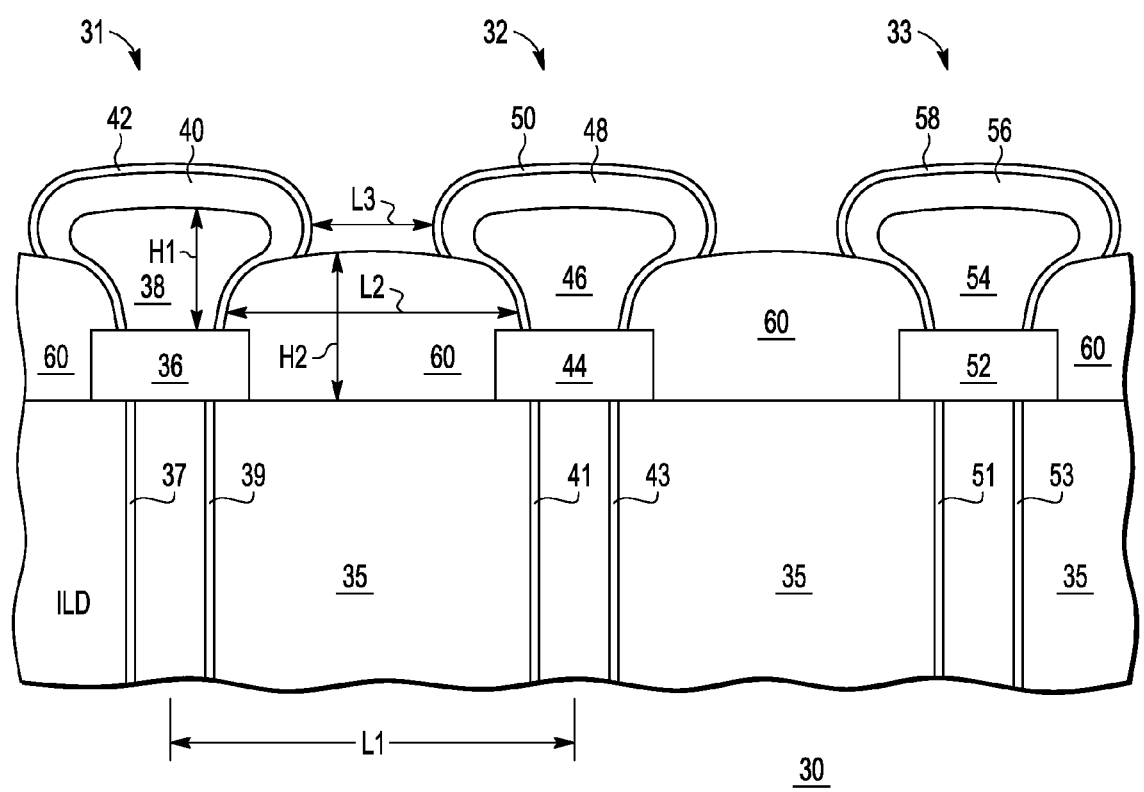
FIG. 7 illustrates in cross-sectional form compact integration of multiple bond structures in accordance with the present invention.

Illustrated in FIG. 7 is a cross-sectional view of a semiconductor device structure 30 having multiple over pad metallizations (OPMs) 31, 32 and 33 which are implemented in a very size efficient layout. The semiconductor device structure 30 has an interlevel dielectric (ILD) 35 upon which are positioned a plurality of bond pads such as bond pad 36, bond pad 44 and bond pad 52. The distance between each bond pad can be reliably short in conjunction with using the above-described process. For purposes of comparison with FIGS. 1-6, bond pad 36 is analogous to conductive layer 14. Overlying bond pads 36, 44 and 52 is nickel layer 38, nickel layer 46 and nickel layer 54, respectively. Nickel layer 38 is analogous to nickel layer 16 of FIGS. 1-6. Overlying nickel layers 38, 46 and 54 is a palladium layer 40, 48 and 56, respectively. The palladium layer 40 is analogous to modified conductive layer 24' of FIGS. 4-6. Overlying palladium layers 40, 48 and 56 is gold layer 42, gold layer 50 and gold layer 58, respectively. Gold layer 42 is analogous to metallic layer 26 of FIGS. 5 and 6. A passivation layer 60 electrically isolates and separates each of the overpad metallizations 31, 32 and 33. Connecting bond pad 36 to underlying circuitry (not shown) are conductive vias 37 and 39. Connecting bond pad 44 to underlying circuitry (not shown) are conductive vias 41 and 43. Connecting bond pad 52 to underlying circuitry (not shown) are conductive vias 51 and 53. It should be understood that any number of conductive vias may be implemented and that only two per bond pad have been illustrated for convenience.

The distance L1 is a bond pad pitch and represents the distance between the centers of two bond pads. To miniaturize a device, this distance is desired to be as small as possible while still making reliable adjacent over pad metallization (OPM) structures. The distance L2 is the distance between sides of the palladium layers 40 and 48 at the upper surface of bond pads 36 and 44. This distance L2 is very close to the distance between two adjacent passivation openings. The minimum separation distance between the over pad metallizations (OPMs) is distance L3 which is desired to be small in order to make smaller die and save money. However, the separation distance can not be too close or otherwise there will be an unacceptable increase in leakage current or bridging (electrical short circuiting) of the over pad metallization structures will occur. In one form the distance L3 is not more than four microns. The height of the nickel layer 38 is H1 and the height of the passivation layer 60 is H2.

In conventional semiconductor die, the distance L1 is significantly large. This means that the distance L3 is also large which permits known bond pad structures to use a capping material that extends significantly over the intervening passivation to protect underlying materials from corrosion.

With the method described herein, it is possible to significantly reduce the distance L1 and still maintain reliability of the bond pads by eliminating the need of extended overlap of over pad metallization (OPM) structures over the intervening passivation. The exposure of the bond pad metal to a corrosive ambient during various processing steps is therefore removed. In particular, the distance L1 may be made at least one-half the conventional distance and provide good bond pad reliability with respect to corrosive effects.

L3 is defined in part by the value of H1 and H2. However, if the L3 distance is too close, there will be significant leakage current between the two adjacent structures. In contrast with conventional structures, the overlap of layer 40 and layer 48 over a portion of passivation layer 60 does not have to be as far as those conventional structures to maintain reliability. It is therefore a distinct advantage of the structure provided herein to provide reliable bond pads as the distance L1 is made smaller.

By now it should be appreciated that there has been provided an improved bond pad structure and method of forming the bond pad structure. Increased bond pad reliability at high temperature operation is provided while the area that is required to implement multiple bond pads is significantly reduced.

In one form there is herein provided a semiconductor device structure having a semiconductor die having a first bond pad and a passivation layer surrounding an inner portion of the first bond pad. A first nickel layer is on the inner portion of the first bond pad wherein the first nickel layer has a sidewall. A first space between the sidewall and the passivation layer extends to the first bond pad. A first palladium layer is over the first nickel layer and fills the first space whereby the first palladium layer is in contact with the first nickel layer in the first space, the first bond pad in the first space, and the passivation layer in the first space. In one form the first bond pad is one of a group of materials including aluminum and copper. In another form the semiconductor device structure has a gold layer over the palladium layer. In another form the semiconductor device structure has a ball bond on the gold layer. In yet another form the semiconductor device structure further has a ball bond on the palladium layer. In another form the semiconductor die has a second bond pad wherein the passivation layer surrounds an inner portion of the second bond pad. The semiconductor device structure further has a second nickel layer on the inner portion of the second bond pad wherein the second nickel layer has a sidewall. A second space between the sidewall of the second nickel layer and the passivation layer extends to the second bond pad. A second palladium layer is over the second nickel layer and fills the second space whereby the second palladium layer is in contact with the second nickel layer in the second space, the second bond pad in the second space, and the passivation layer in the second space. The first bond pad is adjacent to the second bond pad, wherein a closest distance from the first space at the first bond pad to the second space at the second bond pad is not more than four microns.

In another form there is provided a method for forming over pad metallization (OPM) on a semiconductor die having a bond pad in which the bond pad has an inner portion surrounded by a passivation layer. A nickel layer is deposited on the bond pad. An isotropic etchant is applied to the nickel layer to widen a space between the nickel layer and the passivation layer down to the bond pad. A palladium layer is deposited on the nickel layer and in the space so as to be in contact, in the space, with the bond pad, the passivation layer, and the nickel layer.

In another form a gold layer is deposited on the palladium layer. In another form a ball bond is formed on the gold layer. In yet another form a ball bond is formed on the palladium layer. In another form an isotropic etchant is applied by applying a wet etchant that etches nickel selective to the passivation layer and the bond pad. In another form the bond pad is one of a group including aluminum and copper. In another form the passivation layer is nitride and polyimide. In yet another form the nickel layer is deposited by extending the nickel layer above a height of the passivation layer. In another form, depositing the nickel layer extends the nickel layer over a portion of the passivation layer. In another form the semiconductor die further includes a second bond pad. The passivation layer surrounds an inner portion of the second bond pad. A second nickel layer is deposited on the second bond pad. Isotropic etching additionally widens a space between the second nickel layer and the passivation layer down to the second bond pad. An additional palladium layer is deposited on the additional nickel layer. The bond pad is adjacent to the additional bond pad. In one form a closest distance between the space between the second nickel layer and the passivation layer at the additional bond pad and the space between the nickel layer and the passivation layer at the bond pad is not more than four microns.

In another form there is provided a method of making a semiconductor device structure having a bond pad with a surrounding passivation layer. A nickel layer is deposited on the bond pad leaving a space between a sidewall of the nickel layer and the passivation layer. The space is widened to form a widened space. The widened space is filled with palladium. In another form a ball bond is formed over the nickel layer. In yet another form the widening includes performing an isotropic etch of the nickel layer. In yet another form filling the widened spaced is implemented by depositing palladium over the nickel layer.

In the foregoing specification, the invention has been described with reference to specific embodiments. However, one of ordinary skill in the art appreciates that various modifications and changes can be made without departing from the scope of the present invention as set forth in the claims below. For example, any number of via contacts to underlying circuitry may be implemented. Various types of contacts, such as conductive bumps, wires, conductive balls, etc. may be used at an exposed upper surface to make electrical contact to the bond pad. The height of the passivation layer 18 may be either less than or more than the height of the nickel layer 16. While the resulting layers will have a differing shape based upon whether the passivation layer 18 is shorter than the nickel layer 16 or not, the method of etching the separation distance between the nickel layer 16 and the passivation layer 18 prior to filling the increased space with a conductive material remains the same. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming over pad metallization (OPM) on a semiconductor die having a bond pad in which the bond pad has an inner portion surrounded by a passivation layer, comprising:
   depositing a nickel layer on the bond pad, wherein a lack of adhesion between the nickel layer and the passivation layer results in a space between the nickel layer and the passivation layer down to the bond pad;
   applying an isotropic etchant selective for nickel to the nickel layer to widen the space between the nickel layer and the passivation layer down to the bond pad; and
   depositing a palladium layer on the nickel layer and in the space so as to be in contact, in the space, with the bond pad, the passivation layer, and the nickel layer.

2. The method of claim 1, further comprising depositing a gold layer on the palladium layer.

3. The method of claim 2, further comprising forming a ball bond on the gold layer.

4. The method of claim 1, further comprising forming a ball bond on the palladium layer.

5. The method of claim 1, wherein the applying an isotropic etchant comprises applying a wet etchant that etches nickel selective to the passivation layer and the bond pad.

6. The method of claim 1, wherein the bond pad comprises one of a group consisting of aluminum and copper.

7. The method of claim 1, wherein the passivation layer comprises nitride and polyimide.

8. The method of claim 1, wherein the depositing the nickel layer is further characterized by the nickel layer extending above a height of the passivation layer.

9. The method of claim 8, wherein the step of depositing the nickel layer is further characterized by the nickel layer extending over a portion of the passivation layer.

10. The method of claim 1, wherein:
   the semiconductor die further comprises a second bond pad;
   the passivation layer surrounds an inner portion of the second bond pad;
   the step of depositing a nickel layer includes depositing a second nickel layer on the second bond pad;
   the step of applying an isotropic etchant to the nickel layer additionally widens a space between the second nickel layer and the passivation layer down to the second bond pad; and
   the step of depositing a palladium layer includes depositing an additional palladium layer on the second nickel layer;
   the bond pad is adjacent to the second bond pad; and
   a closest distance between the space between the second nickel layer and the passivation layer at the second bond pad and the space between the nickel layer and the passivation layer at the bond pad is not more than four microns.

* * * * *